United States Patent [19]

Dawson et al.

[11] Patent Number: 4,648,211
[45] Date of Patent: Mar. 10, 1987

[54] GRINDING GUIDE AND METHOD FOR CONTROLLING THE AUTOMATIC GRINDING OF OBJECTS

[75] Inventors: Thomas F. Dawson, Millis; Paul C. Ewing, Jr., Tewksbury, both of Mass.

[73] Assignee: The Charles Stark Draper Laboratory, Inc., Cambridge, Mass.

[21] Appl. No.: 772,269

[22] Filed: Sep. 3, 1985

[51] Int. Cl.⁴ .............................................. B24B 49/10
[52] U.S. Cl. ............................... 51/165 R; 51/281 R; 29/593; 29/847
[58] Field of Search ............... 51/281 R, 131.1, 131.3, 51/131.5, 165 R, 165.77; 29/593, 847

[56] References Cited
U.S. PATENT DOCUMENTS
4,477,968 9/1984 Kracke ............................. 51/165 R OTHER PUBLICATIONS
IBM Tech Disclosure Bulletin, vol. 13, No. 4, "Polishing Apparatus", P. J. Grandison, 9-1970.

Primary Examiner—Harold D. Whitehead
Attorney, Agent, or Firm—Joseph S. Iandiorio; Douglas E. Denninger

[57] ABSTRACT

A guide for the grinding of a surface of an object having a region to be examined is provided by this invention. The guide includes at least two conductive leads and a conductive control track interconnecting the conductive leads and extending across the surface to be ground. At least a portion of the rear edge of the track is precisely located with respect to a predetermined grinding depth of the region so that a break in the track occurs with the grinding of the surface to that grinding depth.

25 Claims, 16 Drawing Figures

GRINDING GUIDE AND METHOD FOR CONTROLLING THE AUTOMATIC GRINDING OF OBJECTS

FIELD OF INVENTION

This invention relates to a guide for the grinding of an object to accurately expose at a predetermined guiding depth a region in the object, and more particularly to such a grinding guide which is disposed on a printed circuit board coupon to provide individual control for a number of coupon grinding steps.

BACKGROUND OF INVENTION

Presently, grinding operations are controlled primarily by establishing timing intervals for each application of an abrasive to an object to be ground and by human observation of the rate at which the abrasives wear away the object being ground. In another control procedure, a grinding operator attempts to set mechanical stops at a level corresponding with the desired grinding depth for each grinding operation.

One such object to be ground is a coupon for a printed circuit board. Printed circuit boards provide the mounting surface and electrical interconnection system for components such as diodes, resistors and capacitors. While originally the circuit boards were only printed on a single side, most circuit boards today are double-sided or multilayered. Multilayer printed circuit boards, that is, circuit boards having circuits that are printed on several layers of the boards, require uniform, dependable electrical connections between the layers. These critical connections are typically provided by plated-through holes prepared by drilling holes through the stacked board layers. The drilled holes are plated with copper and then solder to establish the electrical interconnections. Each and every plated-through hole must maintain a predetermined, uniform thickness: pores, cracks, nodules and other faults in plating render the entire circuit board defective.

A number of printed circuit boards are typically defined on a single panel of material. Fortunately for inspection purposes, plating faults typically appear in most of the plated-through holes of a printed circuit board if any faults are present at all. Therefore, one or more coupons are defined on the panel for each circuit board to be printed. Each coupon has one or more test holes which are plated simultaneously with the plated-through holes. The coupons are labelled with a specific identification code for the individual board and are detached for later examination.

The test holes in the coupon are typically aligned with their centerlines in a plane perpendicular to the direction of grinding. They are examined after plating by accurately grinding one edge of the coupon to expose the test holes in cross-section. However, the greater the distance of the cross-section from the centerline, the greater is the error in measurement of actual plating thickness.

Unfortunately for inspection purposes, grinding is presently a tedious, time-consuming process since great accuracy is demanded. At least three or four steps are involved which are accomplished manually or semi-automatically by human supervision of a grinding machine. Typically, one or more coupons are mounted in a holder with one edge protruding. The holder is cast in a mold after the coupons are carefully arranged in the mold. The coupons are aligned in the mold using alignment pins which pass through tooling holes in the coupon. Potting material is then poured into the mold which hardens to form the holder. Grinding machines accept one or more holders in a disk which is equipped with a number of adjustable mechanical stops including hardened material such as diamond.

The protruding edge of each coupon is ground for several minutes against coarse grit rotating at several hundred rpm. The coarse grit is replaced with medium grit, which is rotated against the coupons for an additional one to two minutes. When a semi-automated machine is used, the operator removes the coupons from the medium grit after all diamond stops contact the grit; the operator then resets the diamond stops. Fine grit is then applied against the coupons for thirty to fifty seconds or until all the diamond stops again contact the abrasive. For the grinding machine, the diamond stops are reset flush with the holder. Finally, the coupons with their test holes exposed in cross-section are treated in one or more polishing steps.

The sheer cost and labor of grinding one or more coupons per circuit board present serious problems in view of the ever-increasing millions of printed circuit boards that are produced annually. Presently, most coupons are ground manually at the cost of $15-20 per coupon. Manual grinding requires constant operator attention and frequent inspection using a microscope. Each visual inspection interrupts the grinding operation. The dependability of the operator varies greatly: overgrinding and undergrinding occur frequently. Since the coupons are exposed destructively, a mistake in overgrinding is irreparable and results in the complete invalidation of the matching printed wire board unless a second coupon is available for complete re-grinding. Undergrinding, when detected, is cured by returning the coupon to the operator, who must remount it and commence additional, unscheduled grinding.

Semi-automated or machine-assisted grinding also requires close operator attention. The machines are more dependable than grinding by hand but are not reliable for exposing small test holes due to cumulative sources of error. The tooling holes in one of the coupons can be misplaced relative to the plated-through holes to be examined which results in under-or over-grinding of the coupon. Further, the holder can be initially misaligned in the disk relative to the setting of the mechanical stops, and the stops themselves can wear over time. Also, several holders can be misplaced in a disk relative to each other.

SUMMARY OF INVENTION

It is therefore an object of this invention to provide an improved grinding guide which accurately controls the depth to which an object is ground.

It is a further object of this invention to provide an improved guide for the grinding of printed circuit board coupons to expose test holes.

It is a further object of this invention to provide such a grinding guide which is adapted for fully automated grinding.

It is a further object of this invention to provide such a grinding guide which accurately controls a multiplicity of coupon grinding steps.

It is a further object of the invention to provide such a grinding guide which prevents overgrinding or undergrinding of coupons.

It is a further object of this invention to provide such a grinding guide which is disposed on the coupon itself.

The invention results from the realization that truly effective control over grinding of an object such as a printed circuit board coupon can be achieved using a control track mounted on the coupon and two conductive leads fixed to the track such that a break in the track occurs simultaneously with the grinding to a desired, predetermined position on the coupon.

This invention features a guide for the grinding of a surface of an object having a region to be exposed. There are at least two conductive leads and a conductive control track interconnecting the conductive leads and extending across the surface to be ground. At least a portion of the rear edge of the track is precisely located with respect to a predetermined grinding depth of the region so that a break in the track occurs with the grinding of the surface to that grinding depth.

In one embodiment, the object is a printed circuit board coupon having a test hole to be exposed. The control track and the conductive leads are carried by the coupon; the test hole is encompassed by one of the conductive leads. The rear edge can be precisely located by a recess such as a hole passing through the rear edge of the control track. The precisely located rear edge may be within 0.002 inch of a reference line passing through a diameter of the test hole.

This invention also features a grinding guide including a plurality of conductive leads spaced from each other and a plurality of conductive control tracks interconnecting the conductive leads and extending across the surface to be ground. At least a portion of the rear edge of each track is precisely located with respect to a successive predetermined grinding depth of the test hole so that the tracks are broken successively and a break in each track occurs with the grinding of the surface to that successive test hole grinding depth.

In a preferred embodiment, each conductive lead encompasses a test hole. There are a predetermined number of grinding operations to be performed and there is at least one control track for each grinding operation.

The invention may also be expressed as a grinding guide including a coupon having a test hole to be exposed, at least two conductive leads, and a first conductive control track interconnecting the conductive leads and extending across the surface to be ground. At least a portion of the rear edge of the track is precisely located with respect to a predetermined grinding depth for the test hole to control grinding to that depth.

In one embodiment, the coupon includes a plurality of circuit board layers and the first track is mounted on one of the layers. The grinding guide may further include a second conductive control track interconnecting the conductive leads. The second track extends across the surface to be ground and is disposed on a circuit board layer other than the layer on which the first track is mounted. At least a portion of the rear edge of the second track is also precisely located with respect to the predetermined grinding depth of the test hole. The coupon may include a plurality of test holes aligned so that a break in the track occurs with the grinding of the surface to the same test hole grinding depth for each test hole. The precisely located rear edge of the track is disposed among the test holes.

The invention further features a method of providing a grinding guide including applying to the object a conductive control track aligned in relation to the region to be exposed, attaching a pair of leads to the control track, and positioning, between the leads, at least a portion of the rear edge of the track with respect to a predetermined grinding depth for the region so that a break in the track occurs simultaneously with the grinding of the surface to that grinding depth.

One such object to be ground is a printed circuit board coupon having a test hole to be exposed. The conductive leads can be carried by the coupon and the rear edge of the track can be positioned with respect to the predetermined grinding depth by subsequently removing a portion of the rear edge. The method can further include providing an electrical signal to one of the leads and monitoring the other lead to detect a sudden change in the signal.

DESCRIPTION OF PREFERRED EMBODIMENTS

Other objects, features and advantages will occur from the following descriptions of preferred embodiments and the accompanying drawings, in which.

Figure 1:
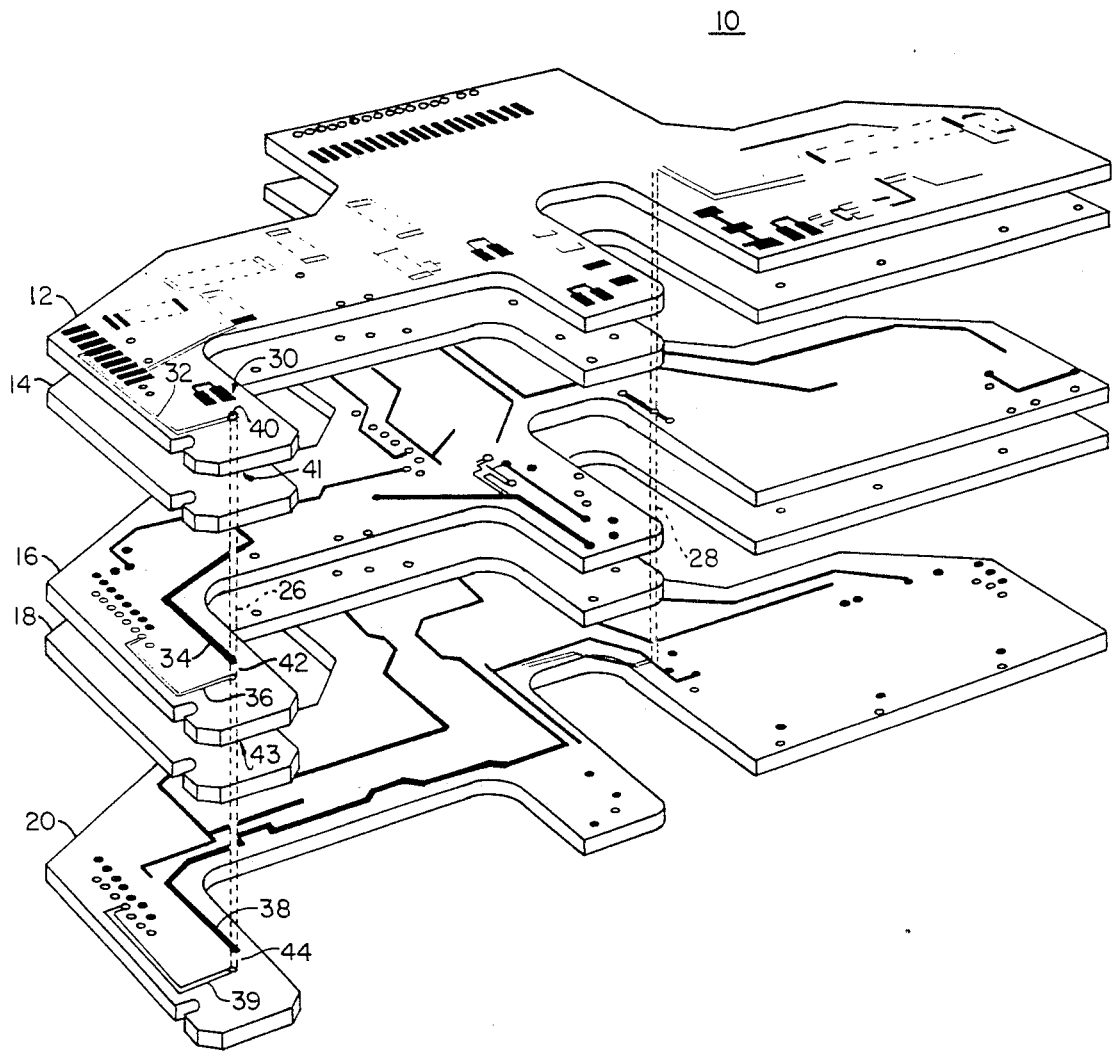
FIG. 1 is an exploded axonometric view of a conventional multi-layer printed circuit board.

While a grinding guide according to this invention can be utilized on objects such as coupons for single- or double-sided circuit boards, the grinding guide is particularly useful for the grinding of coupons for multilayer circuit boards, such as shown in FIG. 1, since a great deal of time and money is invested in each multilayer board. Multilayer printed circuit board 10 includes layers 12, 14, 16, 18, and 20. Circuit board layers 12, 16, and 20 are printed on both sides to place copper cladding on those layers to form the circuits. The circuits are insulated from each other by insulating layers 14 and 18, respectively. Circuits printed on the upper sides of board layers 12, 16, 20 are shown as solid lines while the printed circuits on the underside of these layers are indicated by open lines.

After assembly and alignment of the board layers and the insulating layers relative to each other, the boards are selectively plated to establish plated-through holes to complete the circuits; holes 26, 28, shown in phantom, represent the electrical interconnection provided by the plated-through holes. Components on mounts 30, for example, are interconnected to other components by lines 32, 34, 36, and 38 when holes 40, 41, 42, 43 and 44 in their respective layers are plated as a single plated-through hole as illustrated by hole 26.

Figure 2:
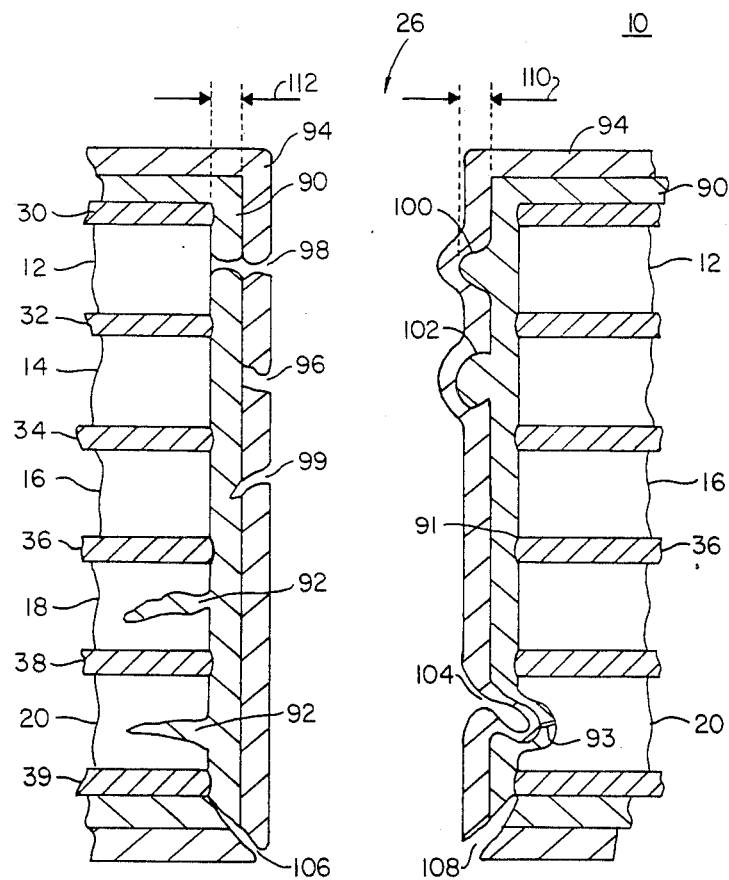
FIG. 2 is a cross-sectional view of an exposed plated-through hole in the multilayer circuit board of FIG. 1 illustrating potential faults in the plating operation.

Plated-through hole 26 of assembled multilayer circuit board 10, FIG. 1, is shown in cross-section in FIG. 2 to illustrate possible faults rising during the final plating-through stage of manufacture; these faults will hopefully be discovered by examining test holes in accompanying coupons. Printed circuit boards 12, 16 and 20 are shown with upper and lower copper cladding 30 and 32, 34 and 36, and 38 and 39, respectively. The circuits are separated internally by insulating layers 14, 18 unless a plated-through hole such as hole 26 electrically connects these circuits. After the layers are assembled together, an additional plating step plates copper cladding 90 through hole 26. Artifact 91 represents a resin smear that was not properly removed and which diminishes the electrical connection between cladding 36 and plating 90. Voids 92 in the laminate indicate a weakened structure and the potential for short circuits between copper cladding circuits. Channel 93 is a hairline crack in plating 90.

Solder plating 94 is then plated over copper plating 90. Defect 96 indicates discontinuous plating while void 98 illustrates a void in the plating penetrating through both copper plating 90 and solder plating 94. Channel 99 represents a large crack which penetrates copper plating 90.

While some defects such as nodule 100 are acceptable, copper plating 90 may develop an unacceptable nodule 102. Also unacceptable are plating pocket 104 and circumferential cracks 106, 108.

Finally, the platings themselves have specified thicknesses. Dimension arrows 110 indicate the range of desired plating thickness for solder plating 92, which is typically 0.001 to 0.002 inch. Dimension arrows 112 represent that the range of acceptable widths for copper plating 90 is 0.001 to 0.002 inch.

The need to determine the quality of plating-through is readily apparent. Also apparent is that individual electrical testing of each and every plated-through hole is prohibitively expensive and time consuming. Further, destructive testing best exposes the defects yet cannot be performed on the printed circuit boards themselves. Separate coupons having a number of sacrificial test holes therefore provide a practical mechanism for ascertaining the plating quality.

Figure 3A:
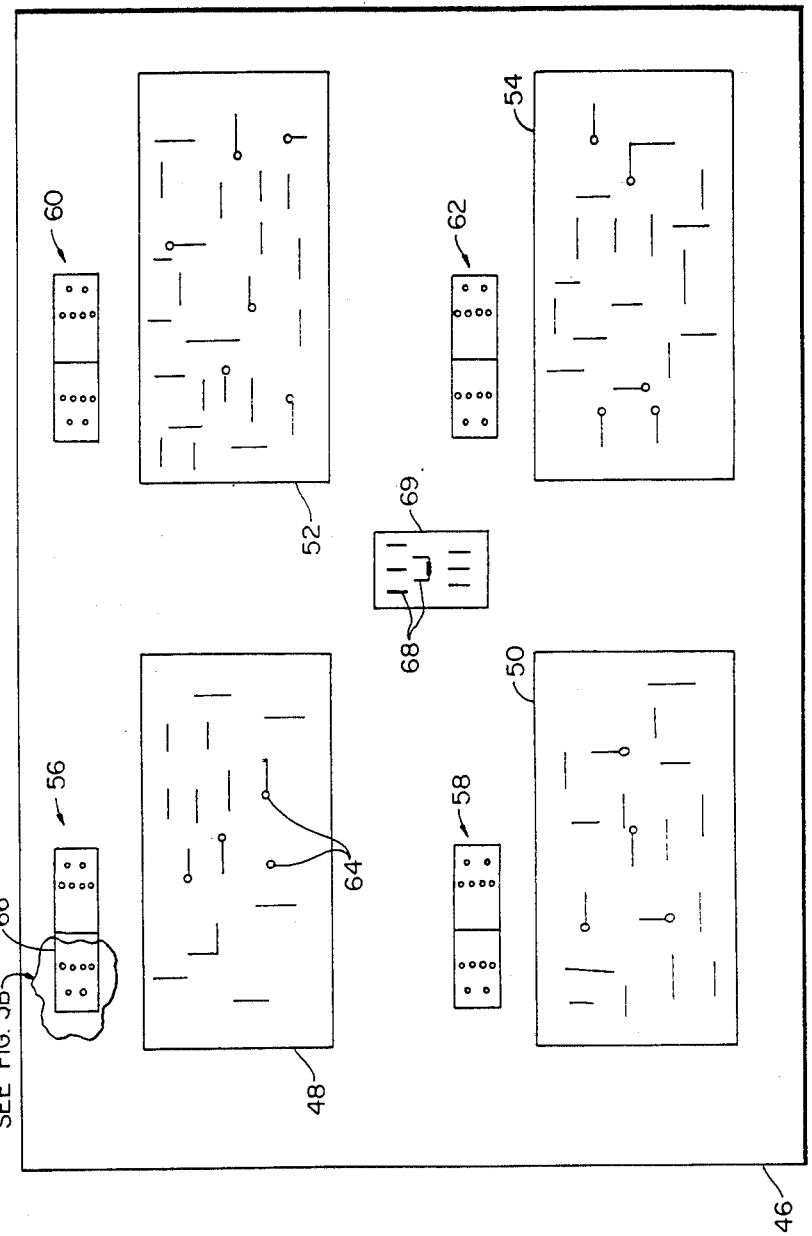
FIG. 3A is a schematic top plan view of conventional coupons and circuit boards disposed on a panel.

Typically, a number of circuit boards are printed on a single panel such as panel 46, FIG. 3A. Printed wire boards 48, 50, 52, and 54 have coupon pairs 56, 58, 60 and 62 located in close proximity on panel 46 to their respective printed wire boards. To test the quality of printing, lines 68 on coupon 69 are later stressed to assure proper plating. To test the quality of plated-through holes such as holes 64 in printed wire board 48, test holes on coupon 66 of coupon pair 56 are subsequently examined in cross-section.

Figure 3B:
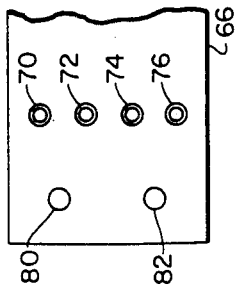
FIG. 3B is an enlarged view of one of the coupons of FIG. 3A.

Coupon 66 is shown in greater detail in FIG. 3B. Typically, test holes 70 and 72 are drilled before holes 64 are drilled and test holes 74 and 76 are drilled afterward to monitor the quality of the drill bit starting and finishing work on board 48. Test holes 70, 72, 74 and 76 are plated through simultaneously with holes 64.

Also shown are alignment holes 80, 82 used for conventionally aligning the coupons in a mold before potting material is added to form a holder which carries the coupon. Coupon 66 is removed from panel 46 using shears or a punch.

Figure 4:
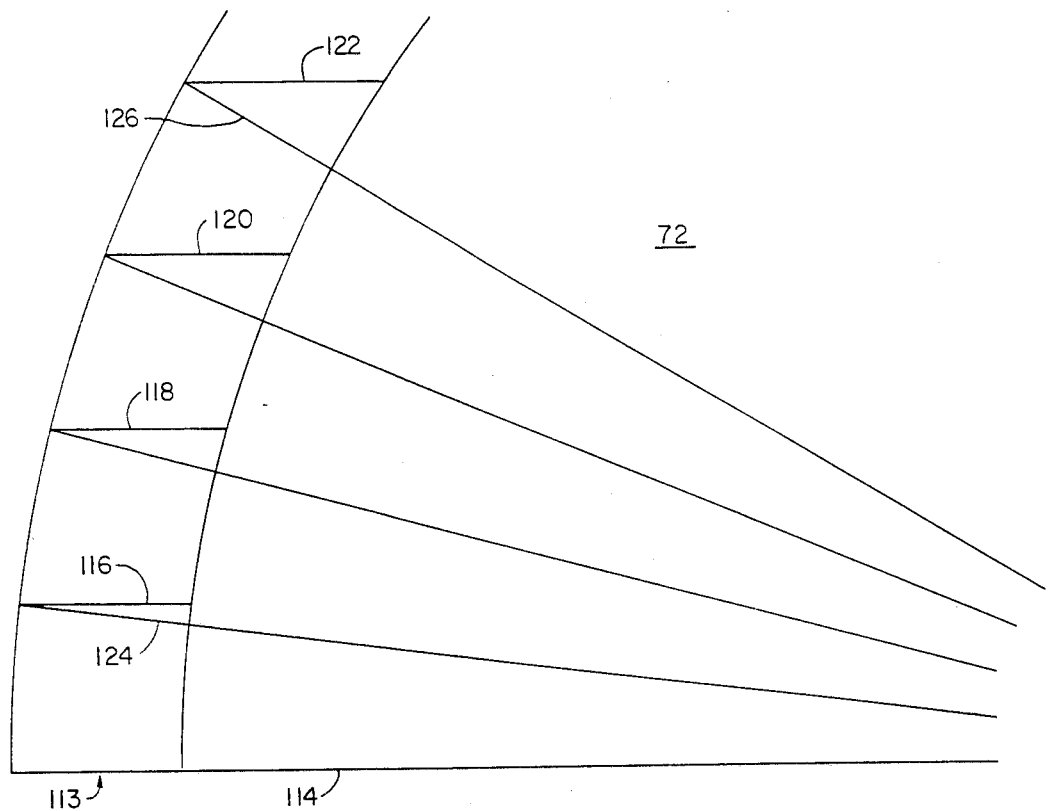
FIG. 4 is a chart of error arising during measurement of plating thickness relative to the distance of the cross section from the diameter of the test hole.

When test holes in a coupon are exposed in cross-section, the depth of exposure affects the measurement of plating thickness. FIG. 4 is a chart of error arising during the measurement of the thickness of copper plating 113 relative to the distance of the cross section from the diameter of plated-through hole 72, FIG. 3B. Line 114 represents a cross section corresponding with the diameter while lines 116, 118, 120 and 122 represent cross sections of exposure which are increasingly displaced from diameter 114. The measurement error with respect to displacement from diameter 114 in mils is shown in Table I when hole 72 is 16 mils and plating 113 is 1 mil.

TABLE I

| MIL DISPL | MEASUREMENT ERROR (mil) |
| --- | --- |
| 1.0 | 0.0250 |
| 2.0 | 0.0625 |
| 3.0 | 0.1000 |
| 4.0 | 0.1750 |

Cross section 116 is displated 0.001 inch—1 mil—relative to line 114. The difference in length between radius line 124 within copper plating 90 and cross section 116 is 0.025 mil. Cross section 122 overestimates the true thickness represented by line 126 by 0.175 mil, which is a 17.5 percent measurement error.

Figure 5A:
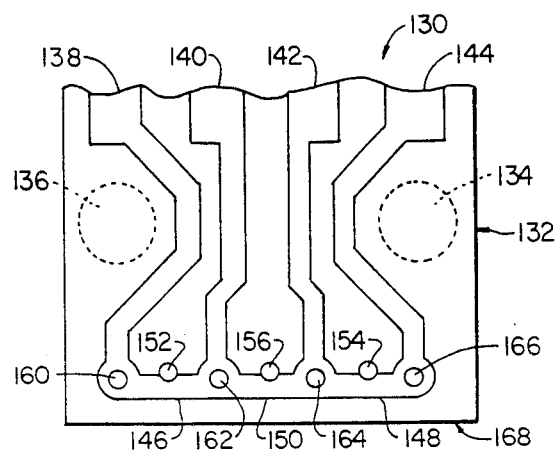
FIG. 5A is a top plan view of a grinding guide according to this invention that is printed on a coupon.

Such errors from overgrinding and undergrinding can be prevented using grinding guide 130 according to this invention as shown in FIG. 5A. Grinding guide 130 is mounted on coupon 132. Tooling holes 134, 136, shown in phantom, are not part of grinding guide 130 but are utilized during conventional handling and alignment of coupon 132. Grinding guide 130 includes conductive leads 138, 140, 142, and 144. Conductive leads 138 and 140 are interconnected by conductive control track 146, leads 142 and 144 are connected by track 148, and leads 140 and 142 are connected by track 150. Control holes 152, 154 and 156 define tracks 146, 148 and 150 as tracks which are successively broken during three grinding steps such as coarse, medium and fine grinding. While the control holes are shown as drilled holes, track material encompassed by hole 152, for example, can be removed by laser etching or other removal method.

Electrically conductive leads 138, 140, 142 and 144 are shown associated with plated-through test holes 160, 162, 164 and 166. As surface 168 of coupon 132 is being ground to expose those test holes in cross section, a break occurs first in track 146 as the grinding erodes material up to control hole 152. A circuit is formed by providing power to lead 140, or another lead responsive to track 150, and sensing current or voltage on lead 138. The circuit is broken when surface 168 is ground through track 146 to control hole 152. A predetermined grinding depth is thereby established by that control track.

After track 146 is breached, a lesser abrasive is applied to grinding surface 168 until track 148 is broken. Finally, grinding with a fine abrasive continues until track 150 is broken. When it is desirable to maintain positive power on a single lead rather than transferring power to successive leads as successive tracks are monitored, track 140 or 142 can be designated as a power lead and the remaining three tracks can be monitored for sudden drops in power indicating a broken track.

Figure 5B:
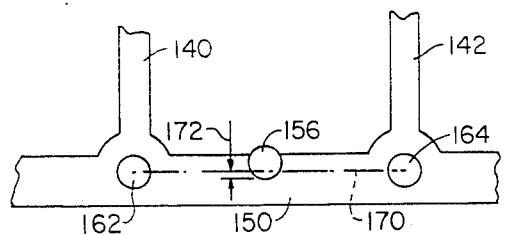
FIG. 5B is an enlarged detailed view of a portion of a control track of FIG. 5A showing its following edge aligned by a drilled hole.

Conductive leads 140, 142 and control track 150 are shown in an enlarged view in FIG. 5B. Control hole 156 is shown in relation to diameter 170 passing through the centers of test holes 162, 164. Dimension 172 illustrates that control hole 156 precedes diameter 170 by a small amount to ensure that the grinding machine conducting the grinding operation has sufficient time to retract coupon 132 from the abrasive and to allow some of surface 168 to be further eroded during polishing. For typical coupon grinding operations, the anticipation distance represented at 172 is 1 to 2 mil. Control track 154, FIG. 5A, anticipates the diameter of the test holes by 3 mil and coarse control track 152 anticipates by 6 mil.

Figure 6:
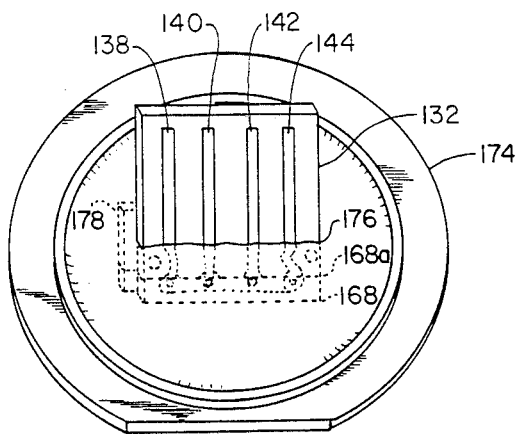
FIG. 6 is an axonometric view of the coupon of FIG. 5A embedded in a coupon mount.

To prepare coupon 132 for grinding, it is "potted" in potting material such as Epo-Kwik epoxy, available from Buehler, which hardens to form coupon mount 174, FIG. 6. Coupon 132 is surrounded by potting material up to line 176. During grinding, surface 168 of coupon 132 is ground down to surface 168a, indicated in phantom.

Conductive leads 138, 140, 142 and 144 are shown slightly raised in thickness so that they project somewhat from the surface of coupon 132. The projection facilitates mating with an edge connector of a grinding machine as described below.

While individual grinding control per coupon is most accurately obtained by grinding a single coupon at a time, two or more coupons can be mounted in the same mount as indicated by coupon 178, shown in phantom. Additional coupons are aligned during potting relative to coupon 132, for example. It is desirable for the upper portion of each non-monitored coupon 178 not to extend far above upper potting material limit 176: physical interference with the interconnection of monitored coupon 132 and the grinding machine is thereby avoided. Coupon 132 is then monitored during grinding to control the grinding of all coupons in mount 174.

Figure 7A:
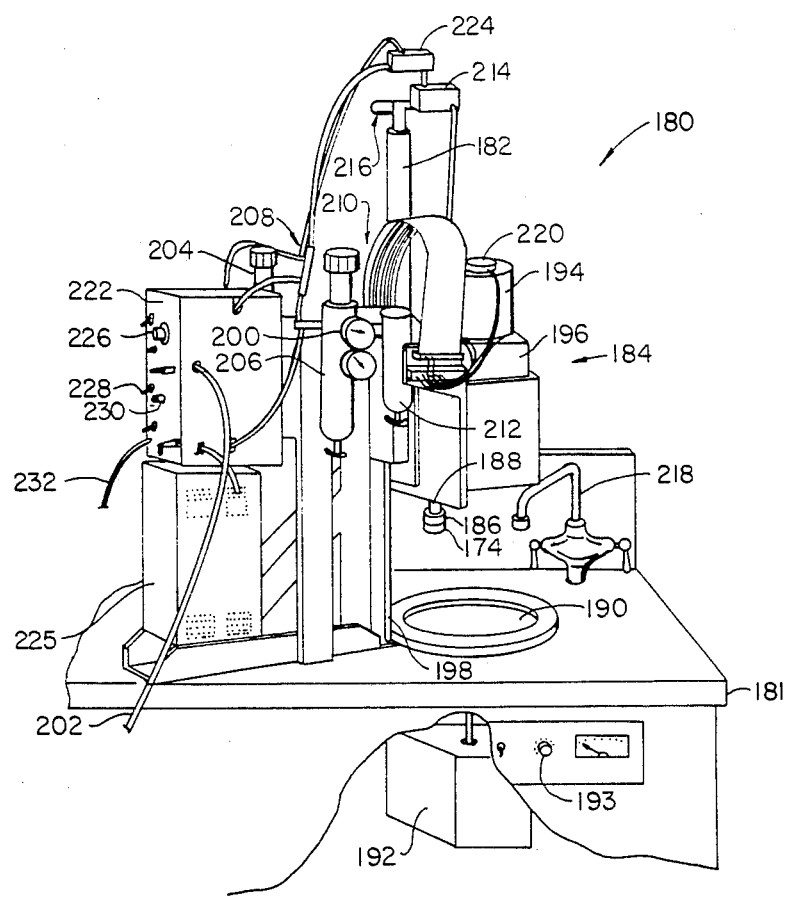
FIG. 7A is an axonometric view of a grinding machine for accepting the coupon mount of FIG. 6.

One example of a machine for grinding objects provided with grinding guides is shown in FIG. 7A. Grinding machine 180, attached to the upper surface of table 181, pneumatically operates a double-acting piston within cylinder 182 to extend and retract slide assembly 184. Slide assembly 184, shown in the retracted position, has holder 186 for securing coupon mount 176.

In the extended position, the coupon in mount 174 is contacted to abrasive wheel 190. Abrasive wheel 190 is rotated in one direction by abrasive motor 192 at a rate controlled by abrasive speed control 193. Smearing of the surface being ground is minimized by rotating the coupons in the same or opposite direction. To increase the effective rate of grinding, the coupon or coupons in coupon mount 174 are rotated in the opposite direction by motor 194. Motor 194 exerts torque on holder 186 through gear box 196 and belt-driven shaft 188.

Figure 7B:
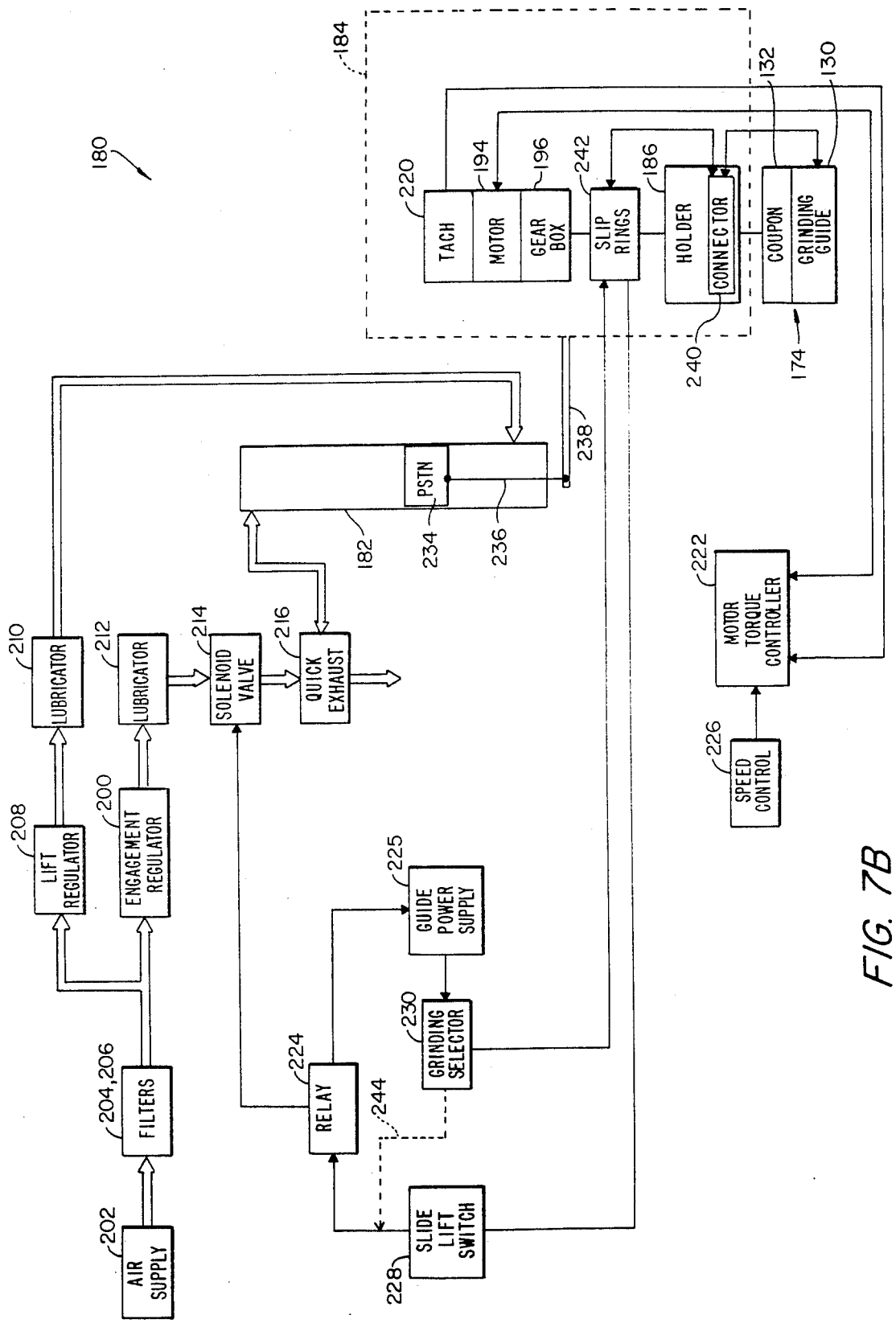
FIG. 7B is a schematic block diagram of the grinding machine of FIG. 7A showing electrical circuits and pneumatic pathways.

To reach the extended position, slide assembly 184 is driven along rail 198 as determined by a balance of pressures controlled by engagement regulator 200 (not visible) and lift regulator 208. Air at a pressure of at least 50 psi is supplied through hose 202 to grinding machine 180 and is filtered by filters 204, 206. As shown in FIGS. 7A and 7B, air passes through lift regulator 208 which controls the pressure of the air entering the lower portion of cylinder 182. Lubricator 210 provides a fog of lubricant to the air entering cylinder 182. Air passes from engagement regulator 200 through lubricator 212 (not visible in FIG. 7A) and is conducted through solenoid valve 214 to quick exhaust valve 216 which is connected to the upper portion of cylinder 182. Engagement regulator 200 is adjusted to pass air at a sufficient pressure to overcome the lift pressure regulated by lift regulator 208. Slide assembly 184 is thereby driven from the retracted to the extended position to engage the coupons against abrasive wheel 190.

During operation, slide assembly 184 is biased toward grinding wheel 190, FIG. 7A, to abraid coupons in mount 174. For wet grinding, water is supplied through faucet 218. Shaft 188 is rotated in a direction opposite to the direction of wheel 190 by motor 194, FIGS. 7A and 7B, at a rate measured by tachometer 220 and controlled by motor torque controller 222. The grinding guides on one or more coupons within mount 174 are interconnected with sensors in grinding machine 180 which monitor voltage or current supplied by guide power supply 225. A break in the control track being monitored trips relay 224 which in turn closes solenoid valve 214. When pressure on the intake portion of exhaust valve 216 ceases, exhaust valve 216 opens to quickly vent pressure in the upper portion of cylinder 182. This allows air pressure provided by lift regulator 208 to quickly drive slide assembly 184 to the retracted position thereby separating the coupons from abrasive 190. Overgrinding or undergrinding of the coupons is thereby avoided.

The housing containing motor torque controller 222 is shown in FIG. 7A having speed control 226, slide lift 228, grinding selector 230, and main power line 232. The electrical circuits and pneumatic pathways of grinding machine 180 are described further in relation to FIGS. 7B and 7C. As shown in FIG. 7B, grinding guide 130 on coupon 132 electrically interconnects with connector 240, such as a conventional edge connector, which is in turn rotatably interconnected to slip ring 242. After the appropriate control track of grinding guide 130 has been selected by grinding selector 230, power from guide power supply 225 passes through slip ring 242 to connector 240 and coupon 132. As long as the control track on coupon 132 remains intact, an energizing circuit is maintained through relay 224. When the control track is ground through, the energizing circuit is broken which trips relay 224 and closes solenoid valve 214. Exhaust valve 216 opens and piston 234 experiences a sudden decrease in pressure on its upper end. The piston rises rapidly, bringing with it slide assembly 184 which is attached to piston shaft 236 by linkage 238.

The energizing circuit can also be broken manually by slide lift switch 228. Alternatively, the energizing circuit can be maintained for a desired period of time through polish line 244.

Figure 7C:
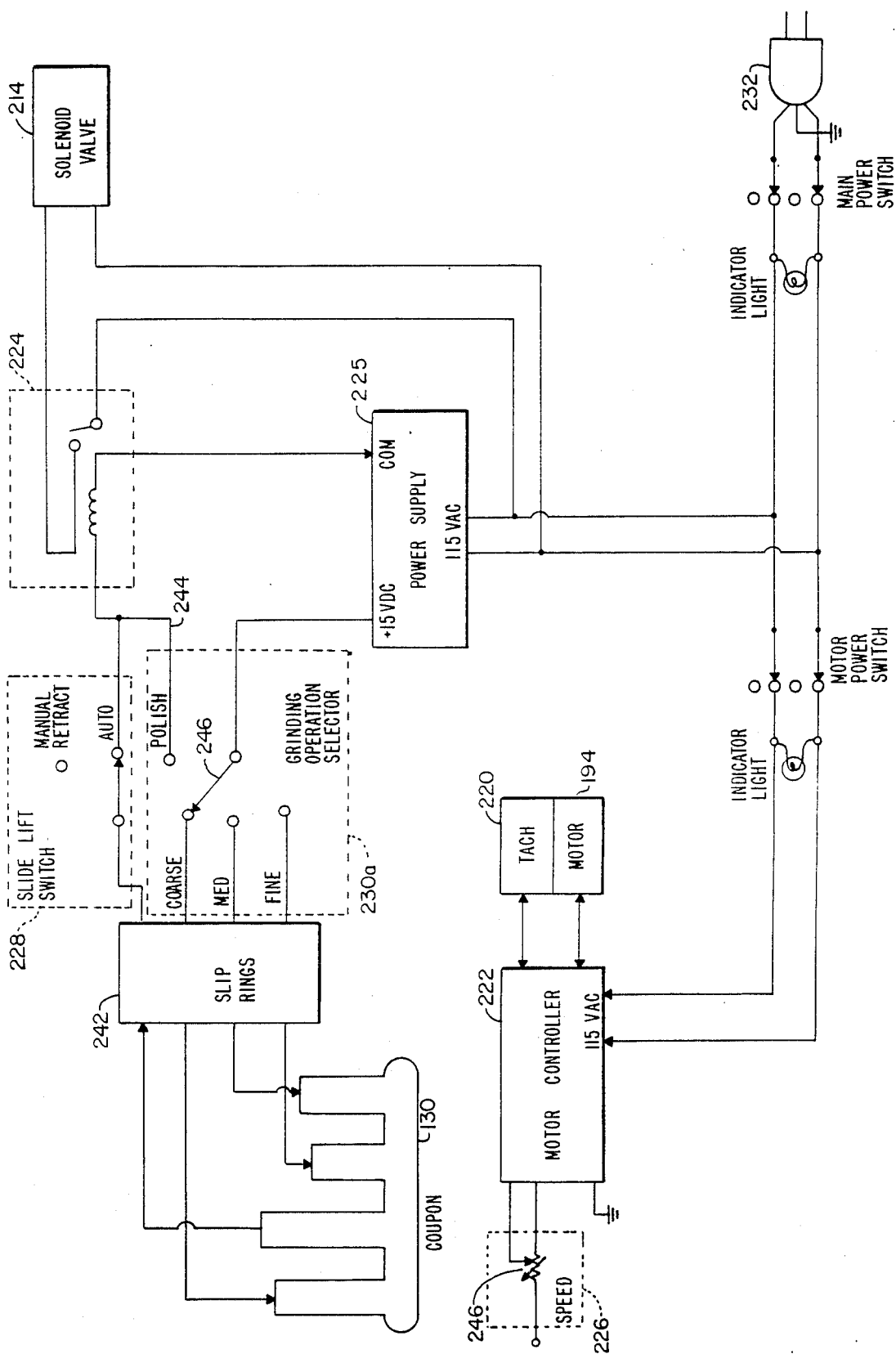
FIG. 7C is a schematic of the electrical circuits of FIG. 7B.

The electrical circuits of FIG. 7B are shown in more detail in FIG. 7C. Speed control 226 includes potentiometer 246. Grinding operation selector 230a successively monitors three separate control tracks on grinding guide 130. Switch 246 is set to COARSE during the first grinding operation. While slide lift switch 228 is set to AUTO, solenoid valve 214 is not activated by relay 224 until the COARSE control track is ground through. The coarse abrasive is then replaced with a medium abrasive and switch 246 is set to medium setting MED. After the medium track is broken, switch 246 is set to FINE to grind the test holes in coupon 132*a* to the desired grinding depth. When the FINE control track is ground through, the fine abrasive is replaced with a polish and switch 246 is held against POLISH, line 244, for thirty to sixty seconds.

Figure 8A:
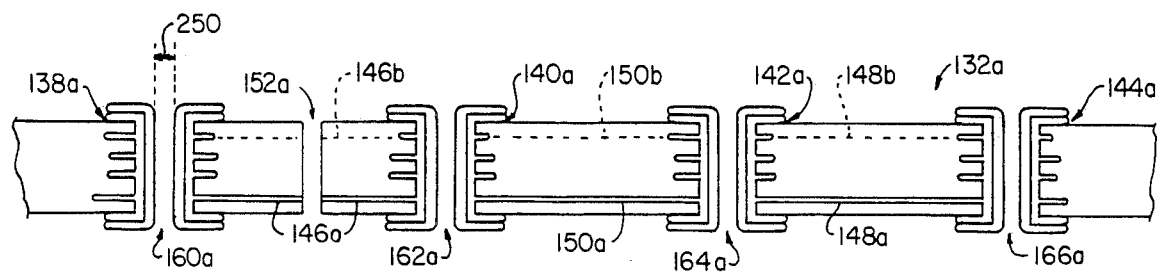
FIGS. 8A–8C are schematic cross-sectional views of a multilayer coupon containing a grinding guide similar to the guide of FIG. 5A after coarse, medium and fine grinding, respectively.
Figure 8B:
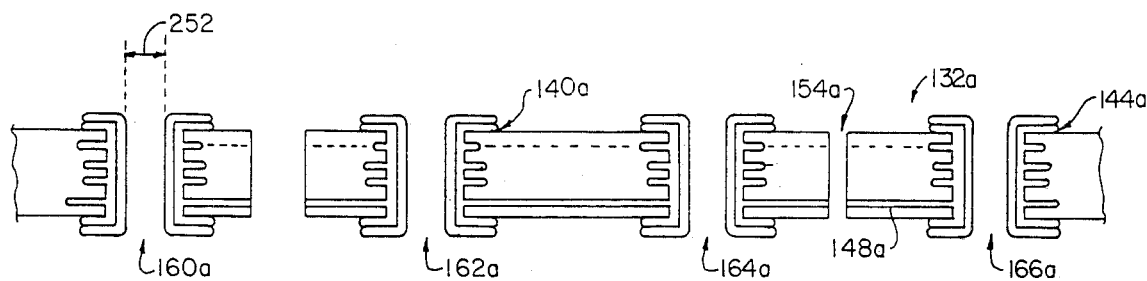
Figure 8C:
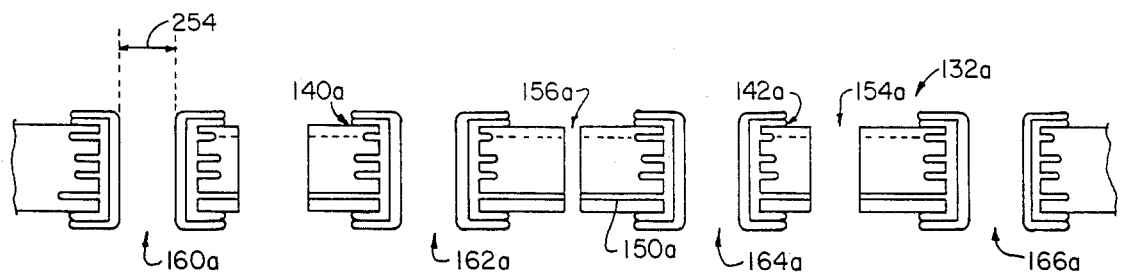

Examples of the different grinding depths achieved in a multilayered coupon are shown in FIGS. 8A through 8C. Multilayered coupon 132*a* carries conductive leads 138*a*, 140*a*, 142*a*, and 144*a* on one of its outer surfaces. A grinding operation, consisting of one or more grinding steps, proceeds until control track 146*a* is ground through, that is, until control hole 152*a* is reached. A circuit previously established between conductive leads 138*a* and 140*a* through track 146*a* and plated-through test holes 160*a*, 162*a* is therefore broken. The width of test hole 160*a* at this predetermined grinding depth is indicated by dimension 250, which is less than the true diameter of test hole 160*a*. Similarly, test holes 162*a*, 164*a* and 166*a* are also ground in cross-section to less than their full diameters.

If control is desired not only over grinding depth but also over grinding angle relative to the axes of the test holes, one or more additional sets of control tracks can be provided. For example, as shown in phantom, control tracks 146*b*, 148*b* and 150*b* are provided on layers other than the layers on which control tracks 146*a*, 148*a* and 150*a* are disposed. Control tracks 146*b*, 148*b*, and 150*b* are electrically connected to conductive leads 138*a*, 140*a*, 142*a* and 144*a* by plated-through test holes 160*a*, 162*a*, 164*a* and 166*a*.

After the grinding operation selector is reset to establish a circuit between conductive leads 140*a* and 144*a*, FIG. 8B, coupon 132*a* is applied to medium abrasive until the rear edge of control track 148*a* is reached at control hole 154*a*. Dimension 252 of test hole 160*a* is greater than dimension 250, FIG. 8A. Next, as shown in FIG. 8C, the cross-sectional surface of coupon 132*a* is ground until the circuit established between conductive leads 140*a* and 142*a* is broken when track 150*a* is ground through. A portion of control hole 156*a* is now revealed in cross section. Dimension 254 of control hole 160*a* is nearly as great as its true diameter. Timed polishing is then conducted to reach the true diameters of the test holes and to facilitate microscopic examination of the test holes.

Figure 9:
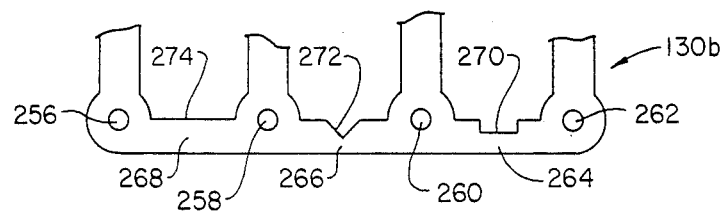
FIG. 9 is a top plan view of control tracks which have their back edges precisely located by alternative arrangements.

While the rear edges of the control tracks of the grinding guides described above have been set by precisely located control holes, this is not a limitation of grinding guides according to this invention. Grinding guide 130*b*, FIG. 9, encompassing test holes 256, 258, 260 and 262, precisely locates the rear edges of control tracks 264, 266, and 268 using different techniques. The rear edge of control track 264 is determined by rectangular notch 270 while that of track 266 is determined by angular notch 272. Accordingly, any recess can be used to establish the rear edge of a control track. Alternatively, the entire control track can be precisely laid perpendicular to the desired depth of grinding. For example, back edge 274 of control track 268 is precisely located with respect to the widths of test holes 256, 258.

Figure 10:
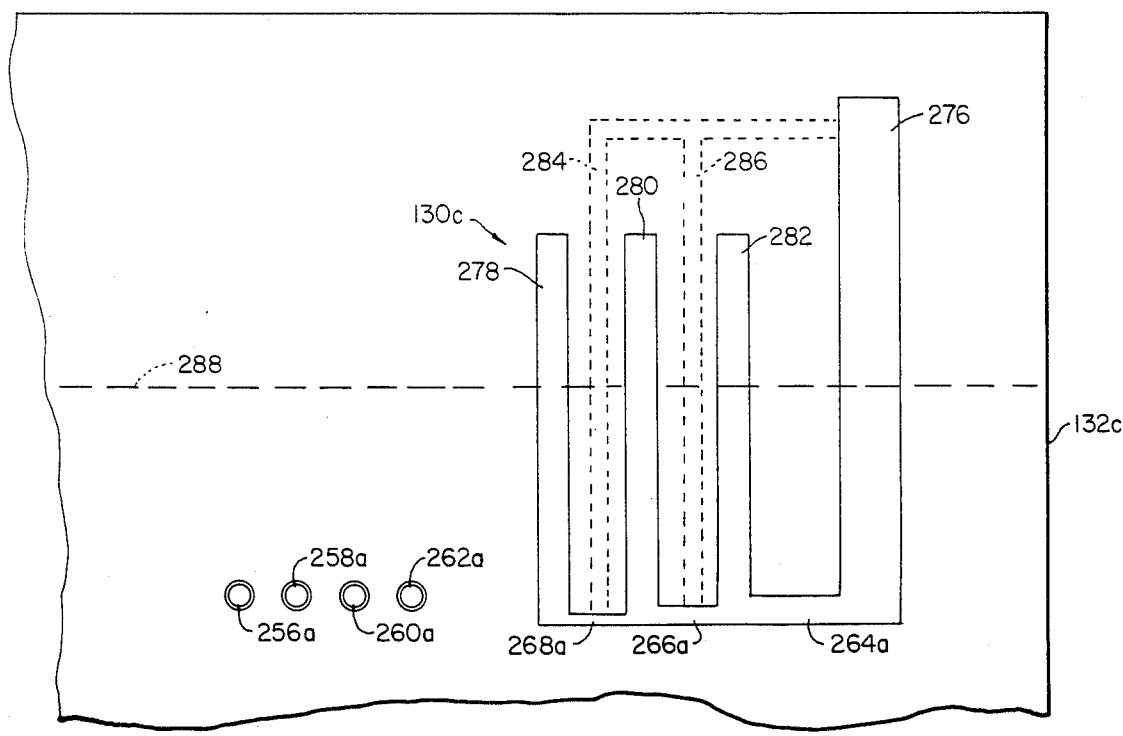
FIG. 10 is a top plan view of yet another grinding guide according to this invention.

Test holes need not be directly associated with the conductive leads or the control tracks of a grinding guide according to this invention when leads directly interconnect with each track. Grinding guide 130*c*, FIG. 10, is mounted on coupon 132*c* separate from test holes 256*a*, 258*a*, 260*a* and 262. During grinding, the first grinding operation is controlled by establishing a circuit through control track 268*a*. This may be accomplished by providing power to conductive lead 276 which is linked to conductive lead 278 through control tracks 264*a*, 266*a* and 268*a*. Alternatively, separate conductive lead 284, shown in phantom, can be provided such that control track 268*a* interconnects power conductive lead 284 and monitored conductive lead 278. The next grinding operation is controlled by the rear edge of track 266*a* which interconnects conductive leads 280 and 276; alternatively, track 266*a* can interconnect tracks 286, shown in phantom, and conductive lead 280. The final grinding operation is controlled by track 264*a* which interconnects power conductive lead 276 and monitored lead 282.

Dashed line 288 illustrates that acceptable lengths of conductive leads 278, 280, 282 and 276 are such that portions of these conductive leads remain externally exposed after potting: line 288 represents an acceptable upper limit of the potting material which covers the test holes. Alternatively, the conductive leads can be located between the layers of a multilayer coupon as long as the grinding machine is able to interconnect at a locus with each conductive lead.

While the grinding guides are described above as guides for the grinding of printed wire board coupons having test holes to be exposed, this is not a limitation of the invention. Grinding guides according to this invention may be used to control the grinding of any object to be ground. The control tracks of the grinding guide for the object can be precisely located during manufacture of the object or can be applied afterward. For integrated or hybrid circuits, the grinding guide can be applied simultaneously to a carrier material using a photolithographic process. The carrier material can be a metal or a ceramic; the region to be exposed can be an integrated circuit chip capacitor or resistor. Alternatively, the control track can be applied after manufacture as a foil tape.

Further, the grinding guide can be used to control the grinding of objects that do not include an electrical circuit. For example, the porosity of a ceramic can be determined by placing a foil tape control track on the ceramic and grinding until the track is breached: the exposed surface is then examined for pore size and density.

In another application, an intact casting is probed with X-rays or ultrasound to locate voids or other defects to be studied. Information provided by the X-ray is used to determine the precise location for the control track. The grinding guide is then directly applied to the casting or the casting is potted in alignment with a grinding guide carried by a separate object that is ground simultaneously with the casting.

Although specific features of the invention are shown in some drawings and not others, this is for convenience only as each feature may be combined with any or all of the other features in accordance with the invention.

Other embodiments will occur to those skilled in the art and are within the following claims:

What is claimed is:

1. A guide for the grinding of a surface of a printed circuit board coupon having a test hole to be exposed, comprising:

at least two conductive leads; and a conductive control track interconnecting said conductive leads and extending across the surface to be ground, at least a portion of the rear edge of said track being precisely located with respect to a predetermined grinding depth of the test hole so that a break in said track occurs with the grinding of the surface to that test hole grinding depth.

2. The grinding guide of claim 1 in which said control track is carried by the coupon.

3. The grinding guide of claim 1 in which said conductive leads are carried by the coupon.

4. The grinding guide of claim 1 in which the test hole is encompassed by said control track and one of said conductive leads.

5. The grinding guide of claim 1 in which said precisely located rear edge is defined by a recess in the rear edge of said control track.

6. The grinding guide of claim 5 in which said recess is a hole passing through the rear edge of said control track.

7. The grinding guide of claim 1 in which said precisely located rear edge is within 0.002 inch of a reference line passing through a diameter of the test hole.

8. A guide for the grinding of a surface of a printed circuit board coupon having a test hole to be exposed, comprising:

a plurality of conductive leads spaced from each other; and a plurality of conductive control tracks interconnecting said conductive leads and extending across the surface to be ground, at least a portion of the rear edge of each said track being precisely located with respect to a successive predetermined grinding depth of the test hole so that said tracks are broken successively and a break in each said track occurs with the grinding of the surface to that successive test hole grinding depth.

9. The grinding guide of claim 8 in which each said conductive lead in combination with at least one of said control tracks encompasses a test hole.

10. The grinding guide of claim 8 in which there are a predetermined number of grinding operations to be performed and there is at least one control track for each grinding operation.

11. A guide for the grinding of a surface of a printed circuit board coupon comprising:

a coupon having a test hole to be exposed;

at least two conductive leads; and a first conductive control track interconnecting said conductive leads and extending across the surface to be ground, at least a portion of the rear edge of said track being precisely located with respect to a predetermined grinding depth of said test hole so that a break in said track occurs with the grinding of the surface to said test hole grinding depth.

12. The grinding guide of claim 11 in which said coupon includes a plurality of circuit board layers and said first track is mounted on one of said layers.

13. The grinding guide of claim 11 in which said coupon includes a plurality of test holes aligned so that a break in said track occurs simultaneously with the grinding of the surface to the same test hole grinding depth for each said test hole.

14. The grinding guide of claim 13 in which said precisely located rear edge is disposed among said test holes.

15. The grinding guide of claim 11 in which there are a predetermined number of grinding operations to be performed and there is at least one control track for each grinding operation.

16. A method of providing a guide for the grinding of a surface of an object to expose a region, comprising:

applying to the object a conductive control track aligned in relation to a predetermined grinding depth for the region;

attaching a pair of leads to the control track; and positioning, between the leads, at least a portion of the rear edge of the track with respect to the predetermined grinding depth by removing a portion of the rear edge so that a break in the track occurs with the grinding of the surface to that grinding depth.

17. The method of claim 16 in which the conductive leads are carried by the object.

18. The method of claim 16 further including providing an electrical signal to one of the leads and monitoring the other lead to detect a sudden change in the signal.

19. A method of providing a guide for the grinding of a surface of a printed circuit board coupon to expose a test hole, comprising:

applying to the coupon a conductive control track aligned in relation to a predetermined grinding depth for the test hole;

attaching a pair of leads to the ctonrol track; and positioning, between the leads, at least a portion of the rear edge of the track with respect to the predetermined grinding depth by removing a portion of the rear edge so that a break in the track occurs with the grinding of the surface to that grinding depth.

20. The method of claim 19 further including providing voltage or current to one of the leads and monitoring the other lead to detect a sudden decrease in the voltage or current.

21. The method of claim 19 in which positioning of the rear edge of the control track and formation of the test hole are accomplished by the same mechanism.

22. A guide for the grinding of a surface of an object having a region to be exposed, comprising:

at least two conductive leads; and a conductive controll track interconnecting said conductive leads and extending across the surface to be ground, at least a portion of the rear edge of said track being precisely located with respect to a predetermined grinding depth of the region so that a break in said track occurs with the grinding of the surface to that grinding depth, said precisely located rear edge being defined by a recess, formed by removal of control track material, in the rear edge of said control track.

23. The grinding guide of claim 22 in which said recess is a hole passing through the rear edge of said control track.

24. The grinding guide of claim 22 in which said control track is carried by the object.

25. A guide for the grinding of a surface of a printed circuit board coupon comprising:

a coupon having a test hole to be exposed and including a plurality of circuit board layers;

at least two conductive leads;

a first conductive control track, mounted on one of said layers, interconnecting said conductive leads and extending across the surface to be ground, at least a portion of the rear edge of said track being precisely located with respect to a predetermined grinding depth of said test hole so that a break in said track occurs with the grinding of the surface to said test hole grinding depth; and
a second conductive control track interconnecting said conductive leads, said second track extending across the surface to be ground, being disposed on a circuit board layer other than said layer on which said first track is mounted, and having at least a portion of its rear edge also precisely located with respect to said predetermined grinding depth of said test hole.

* * * * *